United States Patent [19]

Fazan et al.

[11] Patent Number: 4,981,810
[45] Date of Patent: Jan. 1, 1991

[54] PROCESS FOR CREATING FIELD EFFECT TRANSISTORS HAVING REDUCED-SLOPE, STAIRCASE-PROFILE SIDEWALL SPACERS

[75] Inventors: Pierre C. Fazan; Charles H. Dennison; Ruojia Lee; Yauh-Ching Liu, all of Boise, Id.

[73] Assignee: Micron Technology, Inc., Boise, Id.

[21] Appl. No.: 481,096

[22] Filed: Feb. 16, 1990

[51] Int. Cl.$^5$ ............... H01L 21/265; H01L 21/285
[52] U.S. Cl. ........................ 437/44; 437/41; 437/28; 437/29; 437/30; 437/34; 437/56; 437/57; 437/50; 437/52; 437/238; 156/653; 357/23.6
[58] Field of Search ............ 437/40, 41, 44, 27, 437/28, 29, 30, 34, 56, 57, 50, 52, 235, 238; 357/23.3, 23.4, 23.6, 41, 42, 44; 156/643, 646, 650, 651, 652, 653

[56] References Cited

U.S. PATENT DOCUMENTS

| 4,356,623 | 11/1982 | Hunter | 437/44 |
| 4,466,176 | 8/1984 | Temple | 437/44 |
| 4,728,617 | 3/1988 | Woo et al. | 437/44 |
| 4,740,484 | 4/1988 | Norström et al. | 437/44 |
| 4,818,714 | 4/1989 | Haskell | 437/44 |
| 4,843,023 | 6/1989 | Chiu et al. | 437/44 |
| 4,871,688 | 10/1989 | Lowrey | 437/41 |
| 4,873,559 | 10/1989 | Shimizu et al. | 357/23.6 |
| 4,876,213 | 10/1989 | Pfiester | 437/44 |
| 4,886,765 | 12/1989 | Chen et al. | 437/44 |
| 4,902,635 | 2/1990 | Imamura et al. | 437/44 |

FOREIGN PATENT DOCUMENTS

| 0050773 | 5/1982 | European Pat. Off. | 437/44 |
| 0111706 | 6/1984 | European Pat. Off. | 437/44 |
| 0094985 | 5/1987 | Japan | 437/44 |
| 0136022 | 6/1987 | Japan | 437/44 |
| 0211679 | 9/1988 | Japan | 357/23.3 |
| 0037852 | 2/1989 | Japan | 437/44 |

*Primary Examiner*—Olik Chaudhuri
*Assistant Examiner*—M. Wilczewski

[57] ABSTRACT

The present invention utilizes a wet or vapor isotropic etchback process of carefully controlled duration to create a field-effect transistor having reduced-slope, staircase-profile sidewall spacers formed from a pair of TEOS oxide layers. The spacer's reduced sidewall slope and staircase profile facilitates digit line deposition and aids in reducing the existence of short-prone polysilicon stringers.

6 Claims, 4 Drawing Sheets

PROCESS FOR CREATING FIELD EFFECT TRANSISTORS HAVING REDUCED-SLOPE, STAIRCASE-PROFILE SIDEWALL SPACERS

FIELD OF THE INVENTION

This invention relates to semiconductor technology and, more specifically, to processes for improving digit line step coverage and reducing the incidence of short-prone polysilicon "stringers" in DRAM arrays.

BACKGROUND OF THE INVENTION

In a DRAM array, oxide spacers at the edges of field-effect transistor gates generally serve a two-fold purpose. Firstly, they are used to offset source and drain dopant implants from the gate, so that subsequent high-temperature drive steps will not cause the source and drain implants to diffuse together. In a transistor having both lightly and heavily doped regions within the junctions on both sides of the gate (commonly referred to as a lightly-doped drain or LDD transistor) a primary spacer is utilized to offset the low-dosage implant (phosphorus is generally used for the low-dosage implant in an N-channel device) from the gate, while a secondary spacer is utilized to offset the high-dosage implant (typically arsenic in an N-channel device) from the gate and low-dosage implant. Secondly, spacers are also used to insulate the digit line from the transistor gate. Since FET gates in a DRAM array column are interconnected by a word line (which is generally formed from the same layer of material as the gates), spacers are formed simultaneously along the edges of word lines and transistor gates.

A spacer formation and source/drain doping process is depicted in FIGS. 1 through 4. This process is identical to the one used by Micron Technology, Inc. for the fabrication of its proprietary 4-megabit DRAMs.

Referring now to FIG. 1, a pair of N-channel field-effect transistor gates 11 within a DRAM array have been created on a lightly-doped, p-type monocrystalline silicon substrate 12 by etching a triple-layer sandwich of polysilicon 13, tungsten silicide 14, and silicon dioxide 15. Gates 11 are insulated from substrate 12 by a gate oxide layer 16. Following the blanket deposition and subsequent high-temperature densification of a first conformal tetraethylorthosilicate (TEOS) oxide layer 17, the source/drain regions 18 receive a low-dosage implanting with phosphorus.

Referring now to FIG. 2, the array receives a blanket deposition of a second conformal TEOS oxide layer 21.

Referring now to FIG. 3, the array is subjected to an anisotropic etch which consumes portions of both first TEOS layer 17 and second TEOS layer 21, leaving spacers 31. It will be noted that the anisotropic etch has also reduced the thickness of silicon dioxide layer 15. Subsequent to the anisotropic etch, source/drain regions 18 receive a high-dosage implanting with arsenic.

Referring now to FIG. 4, either a wet isotropic etch or a vapor isotropic etch is employed to widen region 41 where the future bit line will make contact with substrate 12. This etch step consumes the remainder of second TEOS layer 21 and reduces the thickness of the remaining portion of TEOS layer 17. The remaining spacer 42 has a nearly vertical wall portion 43 and a nearly horizontal foot portion 44. In addition some undercutting has taken place at intersection region 45 where vertical wall portion 43 and horizontal foot portion 44 intersect.

During the etch of subsequently deposited polysilicon layers, polysilicon stringers sometimes remain in the undercut intersection region 45. FIG. 5 shows the cross-sectional outline of stringers 51 which have remained in intersection region 45. Since stringers usually run for at least a portion of the length of a word line, they have the potential for shorting the bit line of one row to the bit line of one or more other rows, making the region of the array so affected non-functional. Another disadvantage of the nearly vertical spacer walls is the difficulty of obtaining acceptable step coverage for the future bit line connection. Generally, the steeper the spacer wall, the worse the step coverage.

What is needed is a process for creating a spacer having a new configuration characterized by walls that are less steep, no undercut region, and still thin in order to maximize the size of the bit line contact region on the substrate.

SUMMARY OF THE INVENTION

The present invention utilizes an etchback process of carefully controlled duration to create a field-effect transistor having reduced-slope, staircase-profile sidewall spacers formed from a pair of TEOS oxide layers. Starting with the same anisotropically-etched spacers 31 depicted in FIG. 3, either a wet isotropic etch or a vapor isotropic etch is utilized to etch away only a portion of the remnant of TEOS oxide layer 21. The resulting spacers have a reduced sidewall slope and a staircase profile which facilitates digit line deposition and greatly reduces the potential for short-prone poly stringers. The key to successful creation of the staircase spacer is precision control of the duration of the wet or vapor isotropic etch step.

PREFERRED EMBODIMENT OF THE INVENTION

Figure 1:
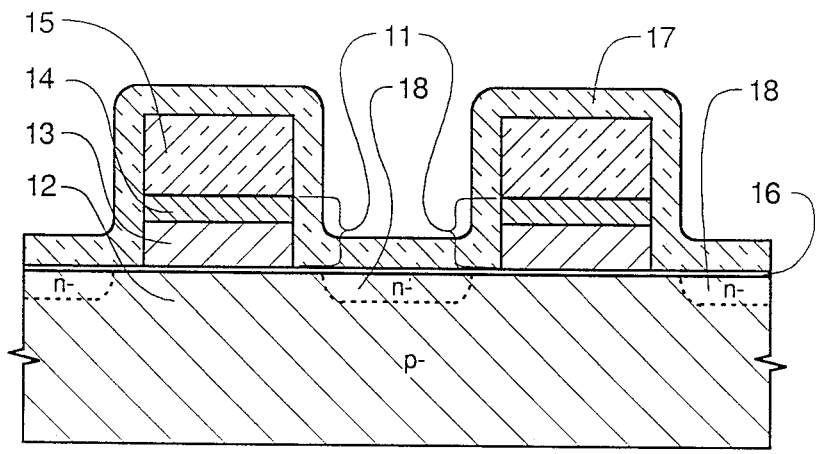
FIG. 1 is a cross-sectional view within a DRAM array undergoing fabrication, showing a pair of N-channel field-effect transistor gates constructed on a lightly-doped p-type monocrystalline silicon substrate, a TEOS oxide layer that has been blanket deposited and high-temperature densified, and source/drain regions that have been created with a low-dosage phosphorus implant.
Figure 2:
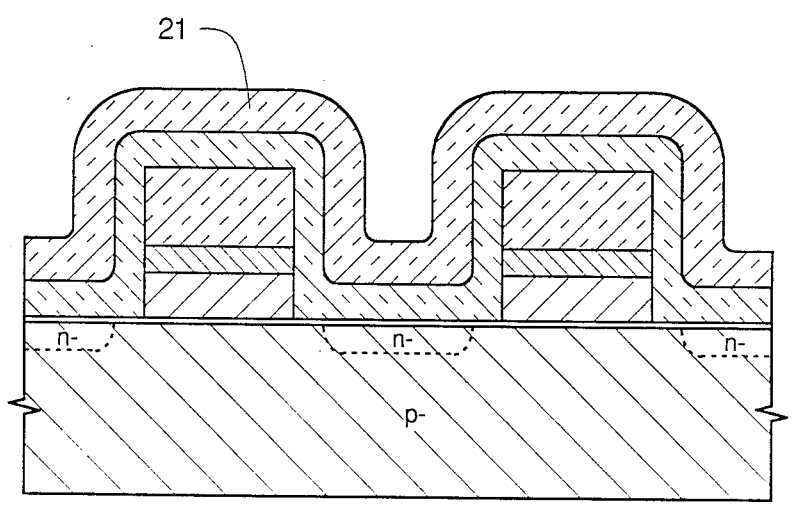
FIG. 2 depicts the pair of transistor gates of FIG. 1 following the blanket deposition of a second conformal TEOS oxide layer 21.
Figure 3:
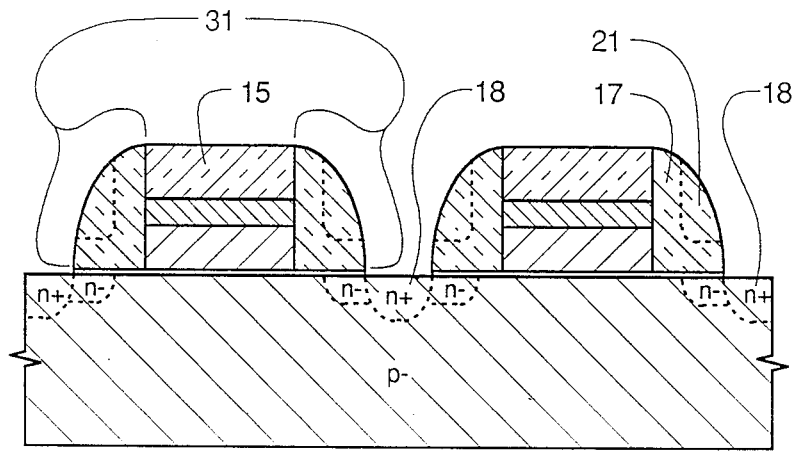
FIG. 3 depicts the pair of transistor gates of FIG. 2 following both an anisotropic dry etch step, which consumes portions of both the first TEOS layer and the second TEOS layer, and a high-dosage arsenic source/drain implant step.
Figure 4:
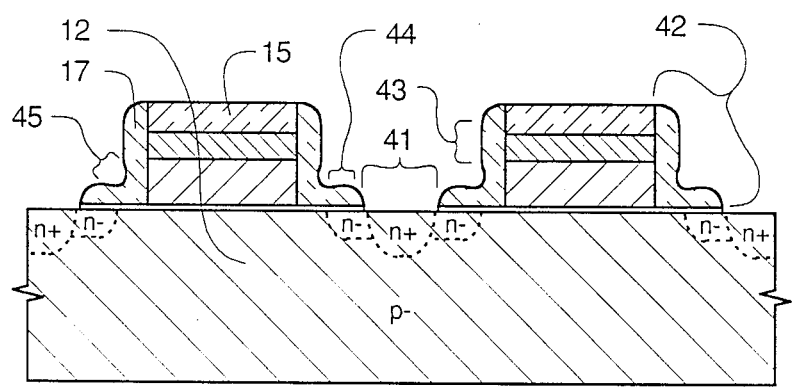
FIG. 4 depicts the pair of transistor gates of FIG. 3 following an isotropic wet etch which consumes the remainder of the second TEOS layer and reduces the thickness of the remaining portion of the first TEOS layer.
Figure 5:
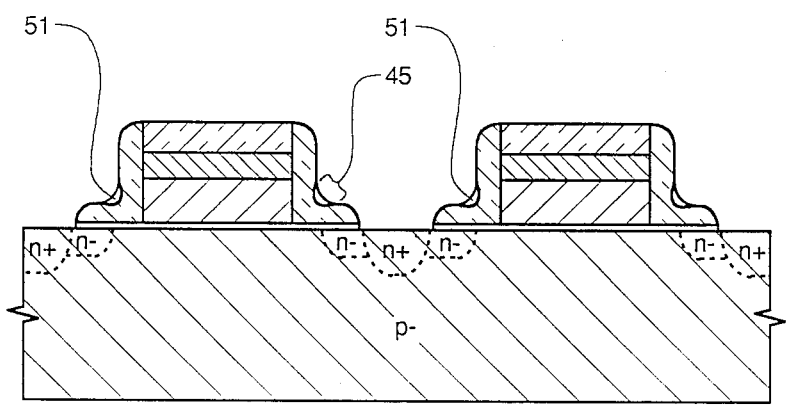
FIG. 5 depicts the pair of transistor gates of FIG. 4 following the blanket deposition and etch of a polysilicon layer, resulting in unwanted, short-prone polysilicon stringers.

In order to create double TEOS layer transistor gate spacers having a reduced sidewall slope and staircase profile, the spacer creation process proceeds as described in the Background section above until the process arrives at the point depicted in FIG. 3.

Figure 6:
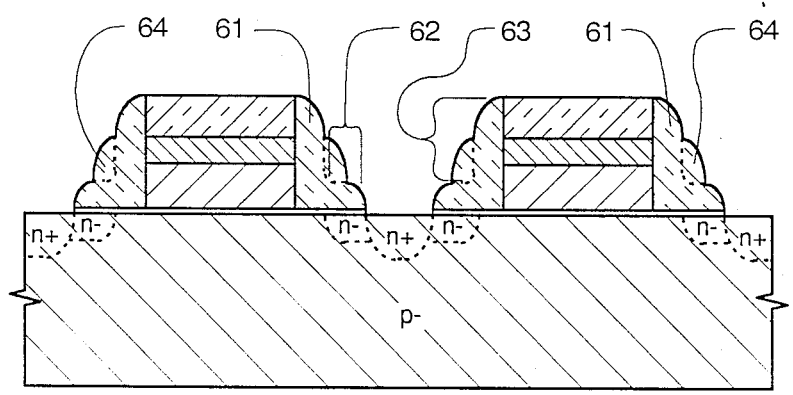
FIG. 6 depicts the pair of transistor gates of FIG. 3 following either a wet isotropic etch or a vapor isotropic etch of reduced duration which leaves a portion of the second TEOS layer intact.

Referring now to FIG. 6, the desired process proceeds with either a wet isotropic etch or a vapor isotropic etch that only partially removes the remaining portion of second TEOS layer 21, resulting in spacer which is comprised of both a densified first TEOS layer portion 61 which has a horizontal component 62 and a vertical component 63, and a second TEOS layer portion 64 which forms an outwardly-curved fillet between horizontal component 62 and vertical component 63. It will be noted that the etch rate of densified first TEOS layer 17 is lower than that of undensified second TEOS 21 layer. Were both TEOS layers densified, the staircase profile would not be nearly as pronounced.

Figure 7:
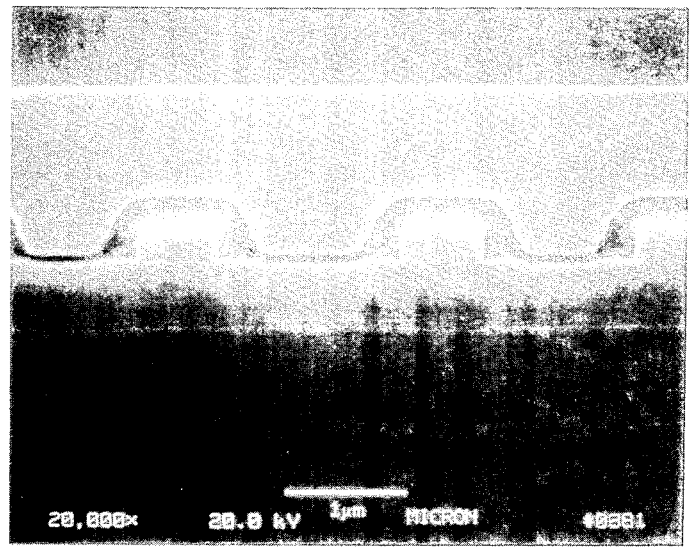
FIG. 7 is a 20,000X photomicrograph taken with a scanning electron microscope shows three neighboring FET gates, each of which has a pair of spacers fabricated in accordance with the present invention.

Referring now to FIG. 7, a 20,000X photomicrograph taken with a scanning electron microscope shows three neighboring FET gates, each of which has a pair of spacers fabricated in accordance with the present invention.

Although only a single embodiment of the staircase spacer fabrication process has been described, it will be apparent to one skilled in the art that changes and modifications may be made thereto without departing from the spirit and the scope of the invention as claimed.

We claim:

1. A process for creating an N-channel field effect transistor, said transistor having both lightly-doped and heavily-doped source and drain regions and a gate which is superjacent to a pad oxide-insulated monocrystalline silicon substrate, said gate comprising a rectangular solid of conductive material having substantially vertical side walls and a substantially horizontal upper surface, said gate having staircase-profile sidewall spacers fabricated from a pair of TEOS oxide layers, said process comprising the following steps:
   (a) blanket deposition of a first TEOS oxide layer on top of said gate and on top of said insulated substrate;
   (b) densification of said first TEOS oxide layer;
   (c) subjecting said source and drain regions to a low-dosage implant using a first n-type dopant;
   (d) blanket deposition of a second TEOS oxide layer on top of said first TEOS oxide layer;
   (e) etching both TEOS oxide layers with a dry anisotropic etch until both TEOS layers have been removed from said horizontal upper surface;
   (f) subjecting said source and drain regions to a high-dosage implant using a second n-type dopant; and
   (g) etching the remnant of said second TEOS oxide layer with an isotropic etch until said remnant of said second TEOS layer has been reduced in size to the point where a three step spacer has been created on each side of said gate, the first and third steps of each spacer being comprised of a remnant of said first TEOS layer and the second step of each spacer being comprised of a remnant of s id second TEOS layer.

2. The process of claim 1 wherein the isotropic etch of step (g) is a wet isotropic etch.

3. The process of claim 1 wherein the isotropic etch of step (g) is a vapor isotropic etch.

4. The process of claim 3 wherein the densified first TEOS oxide layer etches at a slower rate during isotropic etch step (g) than the undensified second TEOS layer.

5. The process of claim 1 wherein said first n-type dopant is phosphorus.

6. The process of claim 1 wherein said second n-type dopant is arsenic.

* * * * *